(12) United States Patent
Ukai et al.

(10) Patent No.: US 8,438,722 B2
(45) Date of Patent: May 14, 2013

(54) APPARATUS AND METHOD FOR DETECTING COMPONENT ATTACHMENT

(75) Inventors: Hidehiro Ukai, Tokyo (JP); Ryota Asai, Tokyo (JP)

(73) Assignee: Hirata Corporation, Tokyo (JP)

( * ) Notice: Subject to any disclaimer, the term of this patent is extended or adjusted under 35 U.S.C. 154(b) by 982 days.

(21) Appl. No.: 12/521,178

(22) PCT Filed: Jan. 15, 2007

(86) PCT No.: PCT/JP2007/050390
§ 371 (c)(1),
(2), (4) Date: Jun. 25, 2009

(87) PCT Pub. No.: WO2008/087694
PCT Pub. Date: Jul. 24, 2008

(65) Prior Publication Data
US 2010/0018038 A1    Jan. 28, 2010

(51) Int. Cl.
*B23P 19/00*    (2006.01)
(52) U.S. Cl.
USPC ................................................ 29/714
(58) Field of Classification Search ........... 29/714
See application file for complete search history.

(56) References Cited

FOREIGN PATENT DOCUMENTS

| JP | 64-58435 | 3/1989 |
|---|---|---|
| JP | 5-55795 | 3/1993 |
| JP | 7-18497 | 5/1995 |
| JP | 8-184632 | 7/1996 |
| JP | 2000-133996 | 5/2000 |

OTHER PUBLICATIONS

International Search Report issued Feb. 6, 2007 in the International (PCT) Application of which the present application is the U.S. National Stage.

*Primary Examiner* — David Bryant
*Assistant Examiner* — Moshe Wilensky
(74) *Attorney, Agent, or Firm* — Wenderoth, Lind & Ponack, L.L.P.

(57) ABSTRACT

An apparatus for detecting component attachment of the present invention includes a detection head for detecting presence or absence of a component or whether or not a component is attached, and a driving mechanism for driving the detection head in an attachment direction of the component. The detection head includes a movable element having a distal end portion capable of being brought into contact with a predetermined portion of the component, a guide passage for guiding the movable element in the attachment direction so as to be capable of reciprocal motion, a fluid passage for passing a fluid when the distal end portion is brought into contact with the predetermined portion and pushed and the movable element is moved to a predetermined position, and a detection portion for detecting a pressure or a flow rate of the fluid flowing through the fluid passage.

6 Claims, 14 Drawing Sheets

APPARATUS AND METHOD FOR DETECTING COMPONENT ATTACHMENT

BACKGROUND OF THE INVENTION

I. Technical Field

The present invention relates to an apparatus and a method for detecting component attachment which detects the presence or the absence of a component or whether or not a component is attached at a predetermined attachment position in a mounting process of electronic components and the like and particularly to an apparatus and a method for detecting component attachment which detects, at the same time when an attachment operation by pressing is completed, whether or not the component has been attached at the predetermined attachment position.

II. Description of the Related Art

As an apparatus for detecting presence or absence of a component, to detect whether or not a component is sucked at the distal end of a nozzle for sucking and holding a component, an apparatus provided with a movable element capable of coming in/out by reciprocal motion provided in a passage of the nozzle, an annular groove (groove) formed on an outer peripheral face in the middle of the movable element, an optical passage which communicates with the annular groove when the movable element is buried in the nozzle and interrupts the communication with the annular groove when the movable element protrudes from the nozzle, a transmission-type optical sensor provided on the optical passage and the like is known (See Japanese Unexamined Patent Publication No. 2000-133996, for example).

In this apparatus, when the movable element is buried and the annular groove and the optical passage communicate with each other (that is, when detection light emitted from a light-emitting element is received by a light receiving element), the fact that the component is sucked by (remains at) the nozzle is detected, and when the movable element protrudes and the communication between the annular groove and the optical path is shut off (that is, the detection light is shut off), the fact that the component is removed from the nozzle (not remaining therein) is detected by detecting.

However, in this apparatus, since the transmission-type photoelectric sensor (light-emitting element, light-receiving element) needs to be arranged with high accuracy with respect to the nozzle, the structure becomes complicated, assembling accuracy needs to be managed, and costs will rise. Also, there is a fear that, due to slight displacement of the movable element (annular groove), the detection light emitted from the light-emitting element is not received by the light-receiving element and the presence or the absence of the component cannot be detected with high accuracy. Moreover, even if the suction of the component by the nozzle can be detected, whether or not the component is attached at the predetermined position cannot be detected.

Also, as a detecting apparatus for detecting the presence or the absence of a defective press-fit of a component, an apparatus provided with a case having a stepped hole and an optical axis hole crossing the stepped hole, a probe capable of coming in/out the stepped hole and having an annular groove (stepped groove) formed on an outer peripheral face and capable of communicating with the optical axis hole, a light emitter and a light receiver arranged at both ends of the optical axis hole, respectively, and the like (See Japanese Unexamined Patent Publication No. 8-184632, for example) is known.

In this apparatus, when the probe is pressed into a predetermined position in the case, and the annular groove and the optical axis hole communicate with each other (that is, the detection light emitted from the light emitter is received by the light receiver), the fact that the component (contact pin) is correctly press-fitted is detected, and when the probe is not pressed into the predetermined position in the case, and the communication between the annular groove and the optical axis hole is interrupted (that is, the detection light is shut off), the fact that the component (contact pin) is not correctly press-fitted (that is, there is a contact pin of defective press-fit) is detected.

However, in this apparatus, since the transmission-type optical sensor (light emitter, light receiver) needs to be arranged with high accuracy with respect to the case, like the above-mentioned apparatus, the structure becomes complicated, the assembling accuracy needs to be managed, and costs will rise. Also, there is a fear that, due to slight displacement of the probe (annular groove), the detection light emitted from the light emitter is not received by the light receiver, and whether or not the component has been correctly press-fitted cannot be detected with accuracy.

Moreover, as another apparatus for detecting component, an apparatus provided with, in order that a component having a terminal for electric connection is pressed and attached to a printed circuit board, an inspection block for holding a component when it is pressed, an inspection probe contained movably in the inspection block in the press direction and capable of contact with the terminal of the component and the like is known (See Japanese Unexamined Patent Publication No. 5-55795, for example).

In this apparatus, when the terminal of the component is correctly inserted, the inspection probe is brought into contact with the terminal and electrically conducted, and the fact that the terminal has been correctly inserted is detected, while if the terminal of the component is bent and not correctly inserted, the inspection probe is not brought into contact with the terminal and not electrically conducted, and the fact that the terminal is not correctly inserted is detected.

However, in this apparatus, since the presence or the absence of the component (whether or not it is correctly attached) is detected based on whether or not electrical continuity can be obtained, the component to be inspected should be an electrically conductive material, and if the inspection probe (detection block) is attached to a movable portion, a bending frequency of wiring and the like connected to the inspection probe gets high, which leads to a fear of disconnection or the like, and repetition of contact and removal of the inspection probe with and from the terminal of the component causes contact failure and leads to a fear that original detection cannot be carried out surely.

SUMMARY OF THE INVENTION

The present invention was made in view of the circumstances of the above prior arts and has an object to provide an apparatus and a method for detecting component attachment with a simple structure and regardless of a material of the component or the like that can detect presence or absence of a component or whether or not the component is attached at a predetermined attachment position easily and with high accuracy and particularly that detects whether or not the component is surely attached at the predetermined attachment position at the same time when an attachment operation by press is completed.

An apparatus for detecting component attachment of the present invention in order to achieve the above object includes a detection head for detecting the presence or the absence of a component or whether or not the component is attached, and a driving mechanism for driving the detection head in an attachment direction of the component. The detection head includes a movable element having a distal end portion that can be brought into contact with a predetermined portion of the component, a guide passage for guiding the movable element so as to be capable of reciprocal motion in the attachment direction, a fluid passage for passing a fluid when the distal end portion is brought into contact with the predetermined portion of the component and pushed and the movable element is moved to a predetermined position, and a detection portion that detects a pressure or a flow rate of the fluid flowing through the fluid passage.

According to this configuration, when the detection head is driven by the driving mechanism in the attachment direction, and the distal end portion of the movable element is brought into contact with the predetermined portion of the component and the movable element is moved to the predetermined position, the fluid flows through the fluid passage, and a pressure or flow rate of the fluid is detected by the detection portion. Therefore, when a predetermined value is detected by the detection portion, it is detected that the component is attached at the predetermined attachment position (or the component is located at the predetermined attachment position), while when the movable element is not moved to the predetermined position, the fluid does not flow through the fluid passage or even though the fluid flows, unless the predetermined value is detected by the detection portion, it is detected that the component is not attached at the predetermined attachment position (the component is not located at the predetermined attachment position).

As mentioned above, since the fluctuation of the fluid interlocking with the movement of the movable element is detected, as compared with the conventional case in which an optical sensor or electric conductivity is used, the structure can be simplified and whether or not the component is attached at the predetermined attachment position (whether or not the component is located at the predetermined attachment position) can be detected easily and with high accuracy, regardless of the material of the components and the like.

In the apparatus with the above configuration, such a configuration may be employed that the fluid passage is formed so as to cross and communicate with the guide passage, and the movable element has a communication path communicating with the fluid passage so as to allow a flow of the fluid when moved to the predetermined position.

According to this configuration, when the movable element is pressed by the predetermined portion of the component and moved to the predetermined position in the guide passage, the communication path formed in the movable element communicates with the fluid passage, and the fluid flows through the fluid passage. Therefore, by detecting the pressure or flow rate of the flowing fluid by the detection portion, it can be detected whether or not the component is attached at the predetermined attachment position (whether or not the component is located at the predetermined attachment position) with higher accuracy.

In the apparatus with the above configuration, such a configuration may be employed that the movable element has a diameter-reduced movable portion defining the distal end portion and a diameter-enlarged movable portion having a diameter larger than that of the diameter-reduced movable portion and defining the communication path, and the guide passage has a diameter-reduced guide passage for containing the diameter-reduced movable portion with a predetermined gap space, a diameter-enlarged guide passage slidably containing and guiding the diameter-enlarged movable portion and crossing and communicating with the fluid passage, and a stepped portion formed at a boundary between the diameter-reduced guide passage and the diameter-enlarged guide passage.

According to this configuration, since the movable element has the diameter-reduced movable portion having the distal end portion and contained in the diameter-reduced guide passage so as to be capable of reciprocal motion and the diameter-enlarged movable portion slidably arranged in the diameter-enlarged guide passage, the diameter-enlarged movable portion can be brought into contact with the stepped portion to a stop position by using appropriate urging means (magnetic force, spring force, and any other urging force, for example).

In the apparatus with the above configuration, the detection head may employ a configuration including a spring for urging the movable element toward a stop position where the diameter-enlarged movable portion is in contact with the stepped portion.

According to this configuration, since the spring is employed as an urging method for positioning the movable element at the stop position, the structure can be simplified, and a returning operation of the movable element to the stop position can be carried out easily by the spring force.

In the apparatus with the above configuration, the detection head may employ a configuration including a rear-end side auxiliary passage formed so as to pass the fluid outward from a side face close to a rear-end side of the diameter-enlarged guide passage with respect to the fluid passage.

According to this configuration, when the fluid flows into the guide passage from the fluid passage and flows into the distal end side of the movable element through the gap with the movable element, it is emitted outward through the gap between the diameter-reduced movable portion and the diameter-reduced guide passage, and when the fluid flows into the rear-end side of the movable element (diameter-enlarged movable portion) through the gap with the movable element, it is emitted outward through the rear-end side auxiliary passage. Therefore, the pressure of the fluid is prevented from acting in the moving direction of the movable element (from both end sides of the movable element), and the movable element is pushed by the predetermined portion of the component (having a shape so as not to block a distal-end opening of the guide passage) and can be surely moved to the predetermined position. As a result, misdetection can be prevented, and detection with high accuracy is realized.

In the apparatus with the above configuration, the detection head may employ a configuration including a distal-end side auxiliary passage formed so as to pass the fluid outward from a side face close to a distal end side of the diameter-enlarged guide passage with respect to the fluid passage, and a rear-end side auxiliary passage formed so as to pass the fluid outward from a side face close to a rear end side of the diameter-enlarged guide passage with respect to the fluid passage.

According to this configuration, when the fluid flows into the guide passage from the fluid passage and flows into the distal end side of the movable element (diameter-enlarged movable portion) through the gap with the movable element, it is emitted outward through the distal-end side auxiliary passage, and when the fluid flows into the rear-end side of the movable element (diameter-enlarged movable portion) through the gap with the movable element, it is emitted outward through the rear-end side auxiliary passage. Therefore, the pressure of the fluid is prevented from acting in the moving direction of the movable element (from both end sides of the movable element), and the movable element is pushed by the predetermined portion of the component (having a shape so as to block a distal-end opening of the guide passage) and can be surely moved to the predetermined position. As a result, misdetection can be prevented, and detection with high accuracy is realized.

In the apparatus with the above configuration, the detection head may employ such a configuration including spring for urging the movable element toward a stop position where the diameter-enlarged movable portion is in contact with the stepped portion, a distal-end side auxiliary passage formed so as to pass the fluid outward from a side face close to a distal end side of the diameter-enlarged guide passage with respect to the fluid passage, and a rear-end side auxiliary passage formed so as to pass the fluid outward from a side face close to a rear-end side of the diameter-enlarged guide passage with respect to the fluid passage, and a combination of the movable element, the guide passage, and the spring is provided in plural arrangement.

According to this configuration, since the combination made up of the movable element, guide passage, and spring is provided in plural arrangement in a state in which the fluid passage, the distal-end side auxiliary passage, and the rear-end side auxiliary passage are made in common, each of the plurality of movable elements is arranged so as to correspond to the predetermined portion of the corresponding component, and the attachment state of the plurality of components can be detected (if all the components are attached correctly) at the same time.

In the apparatus with the above configuration, such a configuration may be employed that the fluid passage, the distal-end side auxiliary passage, and the rear-end side auxiliary passage are formed such that a passage area of a region opened in the diameter-enlarged guide passage is smaller than a passage area of other regions.

According to this configuration, sliding of (the enlarged-diameter movable portion of) the movable element in the diameter-enlarged guide passage can be performed smoothly, and an influence (such as a pressure loss) of the passage on the fluid flowing through the fluid passage, the distal-end side auxiliary passage, and the rear-end side auxiliary passage can be restrained.

In the apparatus with the above configuration, the detection head may employ a configuration having a pressing face for pressing a region other than the predetermined portion of the component.

According to this configuration, the detection head is driven by the driving mechanism so as to hold down (press) the pressing face onto region other than the predetermined portion of the component and to press the component to carry out the attachment operation, and at the same time when the pressing operation is completed, the detection operation by movement of the movable element can be performed.

In the apparatus with the above configuration, the movable element may employ a configuration formed such that the distal end portion does not protrude from the pressing face when the movable element is positioned at the stop position.

According to this configuration, since the movable element is formed so as not to protrude from the pressing face, in movement of the detection head other than the pressing operation and detection operation, the movable element is prevented from being collided with another member to be bent or broken.

In the apparatus with the above configuration, such a configuration may be employed that a positioning unit for positioning a pallet on which the component is placed at a predetermined work position, and an elevating holder for holding and elevating the positioning unit are included, and the elevating holder holds the detection head at an upper region opposing the positioning unit and holds the driving mechanism for driving the detection head.

According to this configuration, since the elevating holder holds the positioning unit at a lower region, the detection head at the upper region, and the driving mechanism at a desired position, respectively, when the elevating holder goes up, the positioning unit positions the pallet on which the component is placed at the predetermined work position, and when the driving mechanism drives downward the detection head in this state, the attachment operation by pressing of the component and whether or not the component has been attached at the predetermined attachment position can be detected.

In this way, since the positioning unit and the detection head are held with respect to the common elevating holder, relative positioning of the both can be made with high accuracy, and the structure can be simplified.

In the apparatus with the above configuration, the elevating holder may employ a configuration formed substantially in a C shape when seen on a side view so as to sandwich a conveying line for conveying the pallet in a horizontal direction from the vertical direction.

According to this configuration, with respect to the conveying line already placed in a production system (such as mounting line, manufacturing line and the like), the device can be moved and installed from the horizontal direction such that the elevating holder sandwiches the conveying line. Therefore, the pallet can be automatically carried in the predetermined work area or automatically carried out of the work area by the conveying line. Also, by forming the elevating holder substantially in a C shape, simplification of the structure, integration of the components, size reduction of the device and the like can be achieved.

In the apparatus with the above configuration, such a configuration may be employed that a conveying unit connected to the conveying line for conveying the pallet in the horizontal direction is further included, and the elevating holder is formed substantially in a C shape when seen on a side view so as to sandwich the conveying unit from the vertical direction.

According to this configuration, by installing this apparatus such that the conveying unit is connected to the conveying line installed in the production system (mounting line, manufacturing line and the like), the pallet can be automatically carried in the predetermined work area or automatically carried out of the work area. Also, by forming the elevating holder substantially in a C shape, simplification of the structure, integration of the components, size reduction of the device and the like can be achieved.

Also, a method for detecting component attachment of the present invention in order to achieve the above object is a method for detecting component attachment for detecting presence or absence of a component or whether or not a component is attached with use of the movable element in contact with a predetermined portion of the component, and by detecting a pressure or flow rate of a fluid flowing when the movable element is brought into contact with the predetermined portion of the component and pushed and moved, the presence or absence of the component or whether or not the component is attached at the predetermined attachment position is detected.

According to the configuration, by detecting a fluctuation of the fluid interlocking with the movement of the movable element, whether or not the component is attached at the predetermined attachment position (whether or not the component is located at the predetermined attachment position) can be detected, and as compared with the conventional case in which an optical sensor is used, the structure of the apparatus to which this method is applied can be simplified, costs can be reduced, and the detection can be made easily and with high accuracy, regardless of the material of the component or the like.

In the method with the above configuration, such a configuration may be employed that, at the same time when a pressing operation to press and attach the component is completed, a fluctuation of the fluid accompanying a movement of the movable element is detected.

According to this configuration, the component attachment operation and the component detection operation can be performed substantially simultaneously or continuously, which eliminates a need of a preparation work during that and can simplify the entire processing operation and can shorten a cycle time of the processing operation.

According to the apparatus and method for detecting component attachment with the above configuration, the presence or the absence of a component or whether or not the component is attached at a predetermined attachment position can be detected easily and with high accuracy, regardless of the material of the component or the like, and at the same time when the attachment operation by press is completed, whether or not the component is surely attached at the predetermined attachment position can be detected.

DETAILED DESCRIPTION OF THE INVENTION

A preferred embodiment of the present invention will be described below with reference to the accompanying drawings.

Figure 1A:
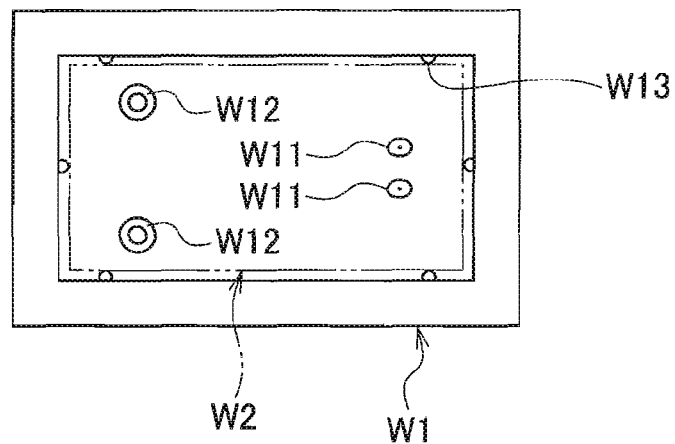
FIG. 1A is a plan view illustrating a component as a base on a side to be attached.
Figure 1B:
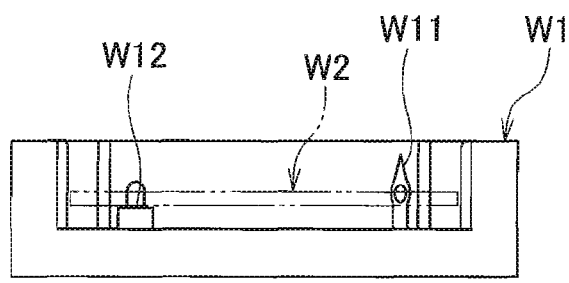
FIG. 1B is a sectional view illustrating a component on the side to be attached.
Figure 1C:
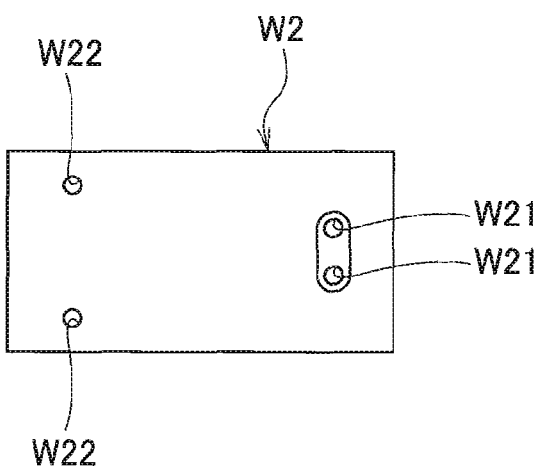
FIG. 1C is a plan view illustrating a component (electronic board) to be attached.

In this embodiment, a component to be detected and attached refers to, as shown in FIGS. 1A to 1C, a box-like component W1 to be a base on a side to be attached and a plate-like component W2 (such as a circuit board) to be attached to the inside of the component W1.

The component W1 is provided with a pin W11 as a predetermined portion of the component provided so as to protrude from a bottom face, a placing portion W12 formed so as to protrude from the bottom face and having a diameter reduced regulating pin, a regulating rib W13 provided on a side face and the like.

The component W2 is provided with, as shown in FIG. 1C, a pin hole W21 to which the pin W11 is inserted, regulating hole W22 to which a regulating pin of the placing portion W12 is inserted and the like.

Here, the pin W11 has a through hole in the middle thereof and is provided with a region formed larger than the pin hole W21 and capable of elastic deformation.

Figure 2:
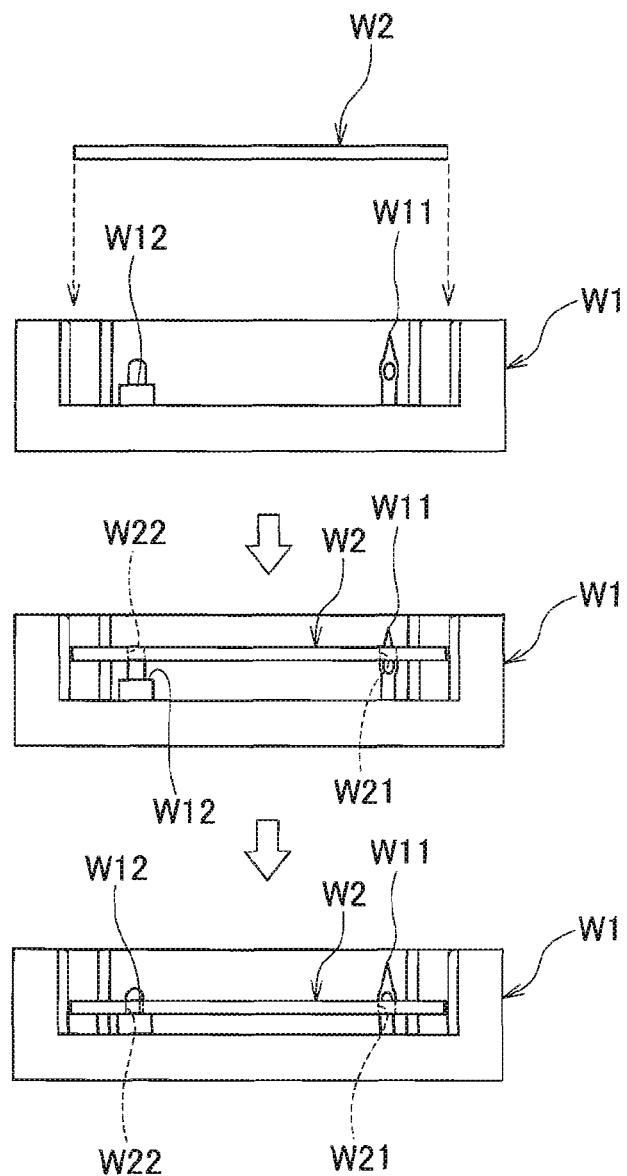
FIG. 2 is a side view illustrating a state in which another component (electronic board) is attached to the component as the base (component)

The component W2 is, as shown in FIG. 2, lowered from above the component W1 and pressed onto the component W1 so that the pin W11 is inserted into the pin hole W21 and the regulating pin is inserted into the regulating hole W22 so as to be placed on the placing portion W12, and thus is attached to the component W1.

Figure 3:
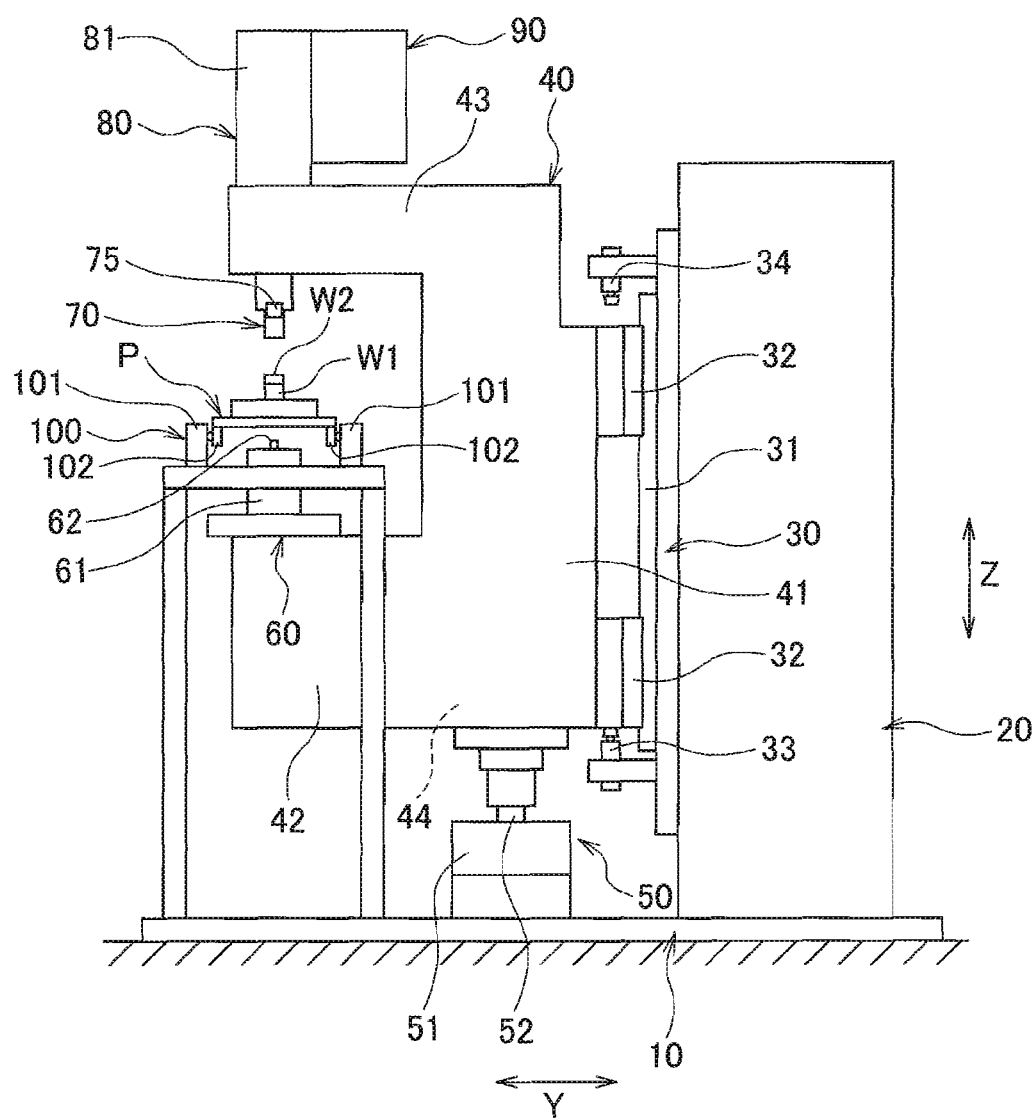
FIG. 3 is a side view of an apparatus for detecting component attachment according to the present invention.
Figure 4:
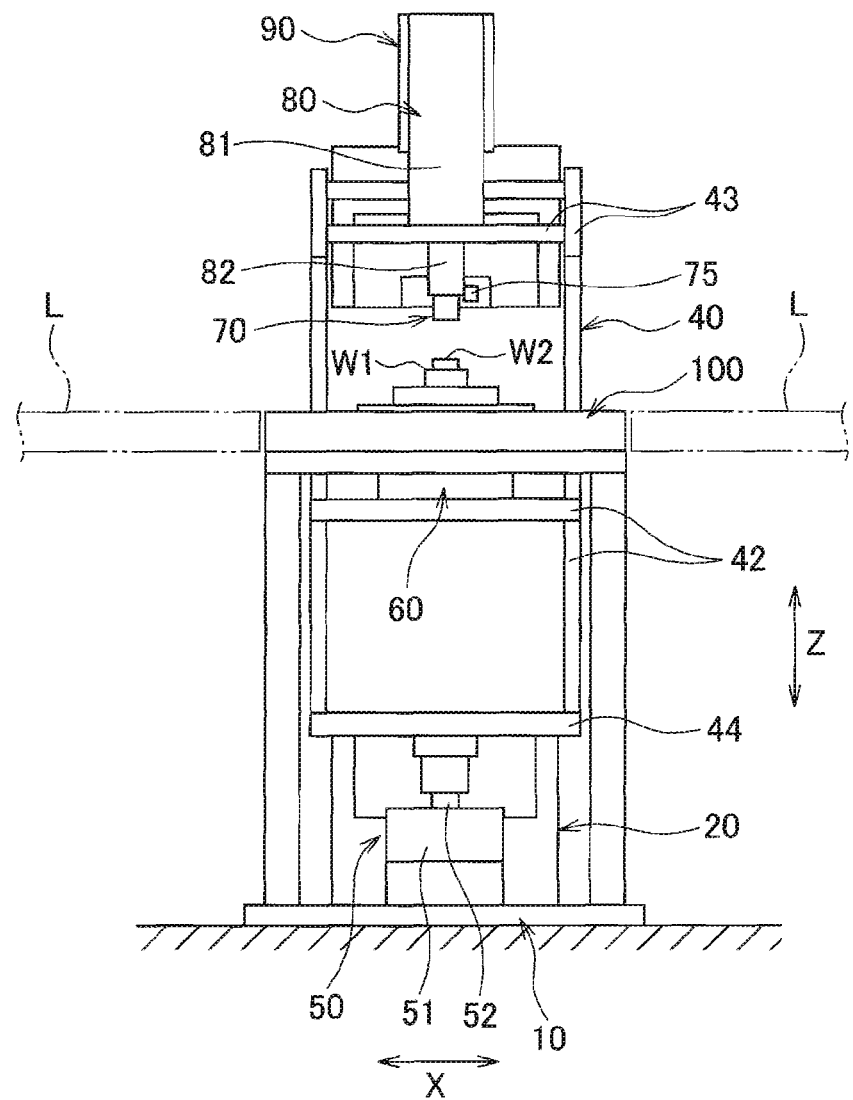
FIG. 4 is a front view of the apparatus for detecting component attachment shown in FIG. 3.
Figure 5:
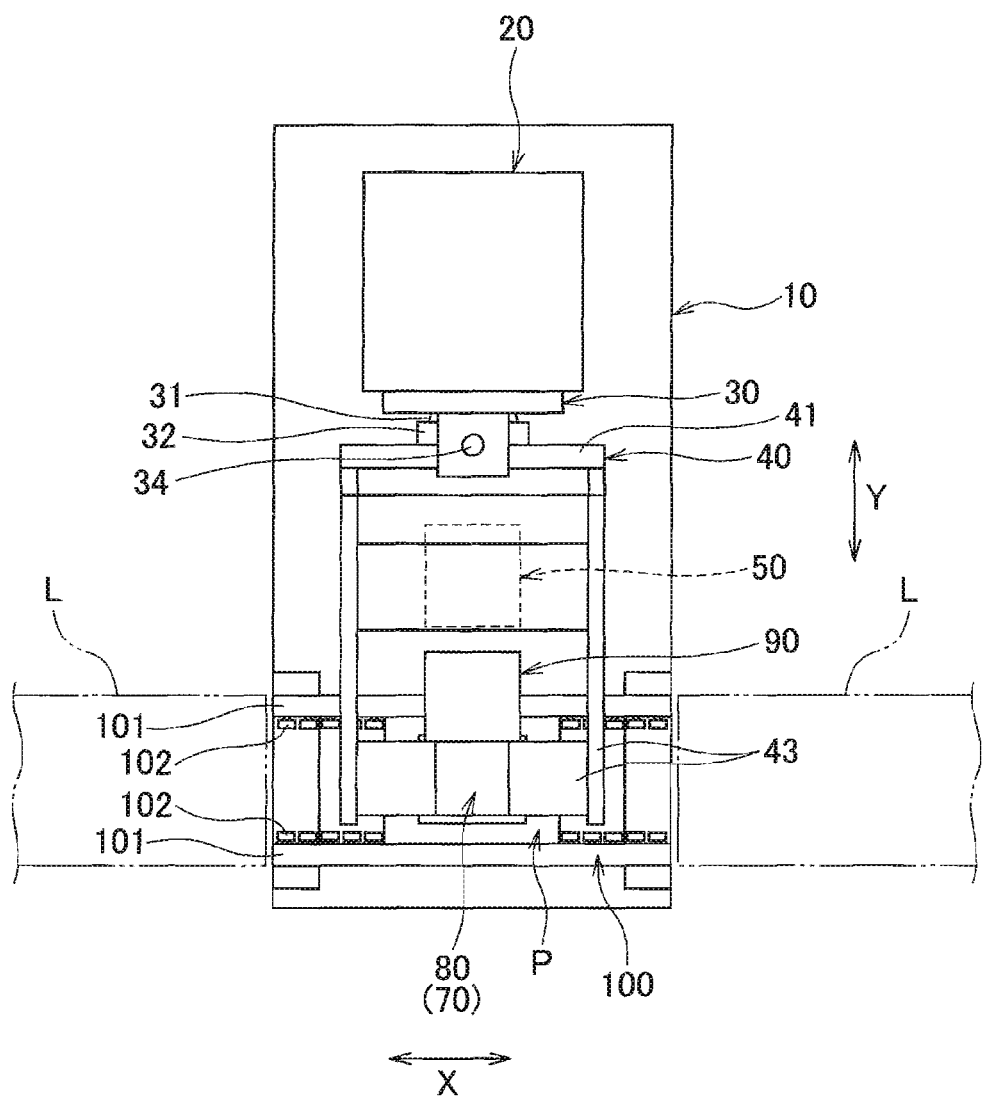
FIG. 5 is a plan view of the apparatus for detecting component attachment shown in FIG. 3.

The apparatus for detecting component attachment is provided with, as shown in FIGS. 3 to 5, a base 10, a support 20 provided upright on the base 10, a guide mechanism 30 provided on the side face of the support 20 in an extended state in a vertical direction Z, an elevating holder 40 supported by the guide mechanism 30 so as to go up and down, a holder driving mechanism 50 provided on the base 10 for elevating and driving the elevating holder 40, a positioning unit 60 provided on the elevating holder 40 for positioning a pallet P on which the components W1, W2 are placed at a predetermined work position, a detection head 70, a head driving mechanism 80, and a control unit 90 respectively provided on the elevating holder 40, a conveying unit 100 provided on the base 10 for conveying the pallet P in the horizontal direction (X direction) in an upper region of the positioning unit 60 and the like.

The base 10 is, as shown in FIGS. 3 and 4, formed in a substantially rectangular plate shape with use of a metal plate or the like. Here, a case in which the base 10 is installed on a floor is shown, but the base 10 may be configured movable with respect to the floor by providing a roller or the like on a lower face of the base 10.

The support 20 is, as shown in FIGS. 1 and 3, formed in a prismatic shape with a profile forming a substantially rectangular section with use of a metal plate or the like and firmly fixed on the base 10.

The guide mechanism 30 is, as shown in FIGS. 3 and 5, provided on the side face of the support 20 and is provided with a guide rail 31 extending in the vertical direction (Z direction), a guide block 32 fixed to the elevating holder 40 and slidably connected to the guide rail 31, a lower-end stopper 33 for regulating a lowering end position of the elevating holder 40 and for absorbing an impact, an upper-end stopper 34 for regulating a rising-end position of the elevating holder 40 and for absorbing an impact and the like.

The elevating holder 40 is, as shown in FIGS. 3 to 5, formed substantially in a C shape when seen on a side view and is provided with a holder base portion 41 to which the guide block 32 is fixed, a lower-side arm portion 42 extending from a lower region of the holder base portion 41 in the horizontal direction (Y direction), an upper-side arm portion 43 extending from an upper region of the holder base portion 41 in the horizontal direction (Y direction), a lower face portion 44 to which the holder driving mechanism 50 is connected and the like.

The lower-side arm portion 42 is formed so as to hold the positioning unit 60 in the lower region than the conveying unit 100.

The upper-side arm portion 43 is formed so as to hold the detection head 70 in the upper region than the conveying unit 100 and in a region opposing the positioning unit 60, to hold the head driving mechanism 80 immediately above the detection head 70 and to hold the control unit 90 adjacently to the head driving mechanism 80.

The lower face portion 44 is formed so as to be connected to (an upper end portion of) a telescopic rod 52 of the holder driving mechanism 50, which will be described later.

That is, the elevating holder 40 is substantially in a C shape when seen on a side view and is formed so as to sandwich the conveying unit 100 from the vertical direction (Z-direction). By forming the elevating holder 40 substantially in a C shape as above, simplification of the structure, integration of the components, size reduction of the apparatus and the like can be achieved. Also, the conveying unit 100 can be easily connected to the conveying line L installed in the mounting line (production system).

The elevating holder 40 integrally holds the positioning unit 60 and the detection head 70 opposed to each other in the vertical direction (Z-direction) and elevates in a predetermined movement range while being guided by the guide mechanism 30 through the driving force of the holder driving mechanism 50.

That is, since the elevating holder 40 holds the positioning unit 60 in the lower region, the detection head 70 in the upper region, and the head driving mechanism 80 at a desired position, when the elevating holder 40 goes up, the positioning unit 60 positions the pallet P on which the component is placed at a predetermined work position, and when the head driving mechanism 80 drives downward the detection head 70 in this state, the attachment operation by pressing of the component and whether or not the component has been attached at the predetermined attachment position are detected.

In this way, since the positioning unit 60 and the detection head 70 are held with respect to the common elevating holder 40, relative positioning of the both can be made with high accuracy, and the structure can be simplified.

The holder driving mechanism 50 is, as shown in FIGS. 3 and 4, provided on the base 10 and provided with a driving actuator 51 for generating an elevating driving force, a telescopic rod 52 telescopically operated by the driving actuator 51 and having its upper end portion connected to the lower face portion 44 of the elevating holder 40 and the like.

The driving actuator 51 is a cylinder using hydraulic pressure, pneumatic pressure and the like, and the telescopic rod 52 is telescopically operated by hydraulic pressure or pneumatic pressure.

That is, when the driving actuator 51 generates a driving force in one direction, the telescopic rod 52 is elongated so as to protrude upward from the contracted state and to raise the elevating holder 40, while when the driving actuator 51 generates a driving force in another direction, the telescopic rod 52 is contracted downward from the elongated state so as to lower the elevating holder 40.

Instead of the driving actuator 51 and the telescopic rod 52, a driving mechanism using a driving motor, a ball screw and a ball nut, rack and pinion mechanism, chain and sprocket and the like may be employed.

The positioning unit 60 is, as shown in FIGS. 3 and 4, provided with a holding portion 61 for holding the lower face of the pallet P, a positioning pin 62 that protrudes from an upper face of the holding portion 61 and can be fitted in the positioning hole of the pallet P and the like.

The positioning unit 60 is held by the lower-side arm portion 43 of the elevating holder 40 and elevated and driven by the elevating holder 40 so as to reciprocally move in the vertical direction (Z-direction) between a standby position located below and away from the pallet P and a work position which rises and lifts the pallet P for positioning.

Figure 6:
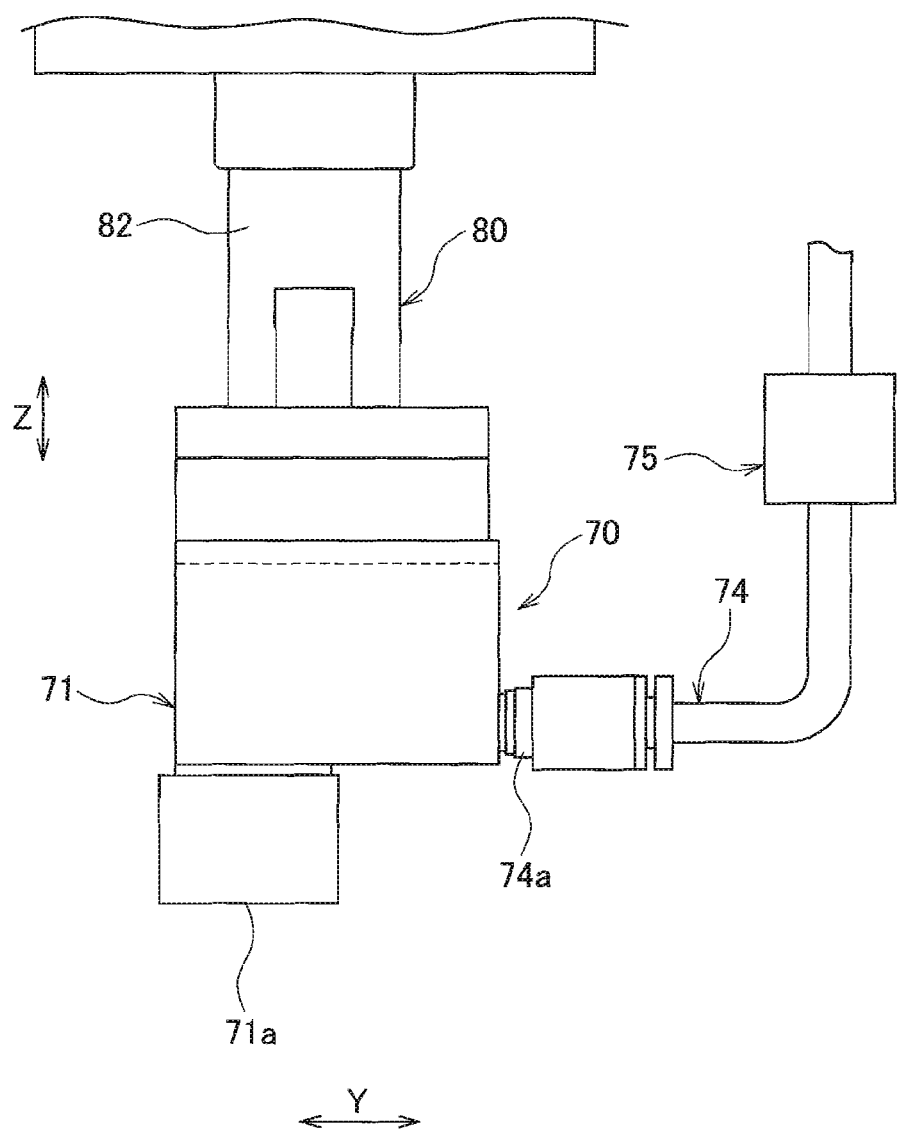
FIG. 6 is a side view of a detection head constituting a part of the apparatus for detecting component attachment shown in FIG. 3 or FIG. 5.
Figure 7A:
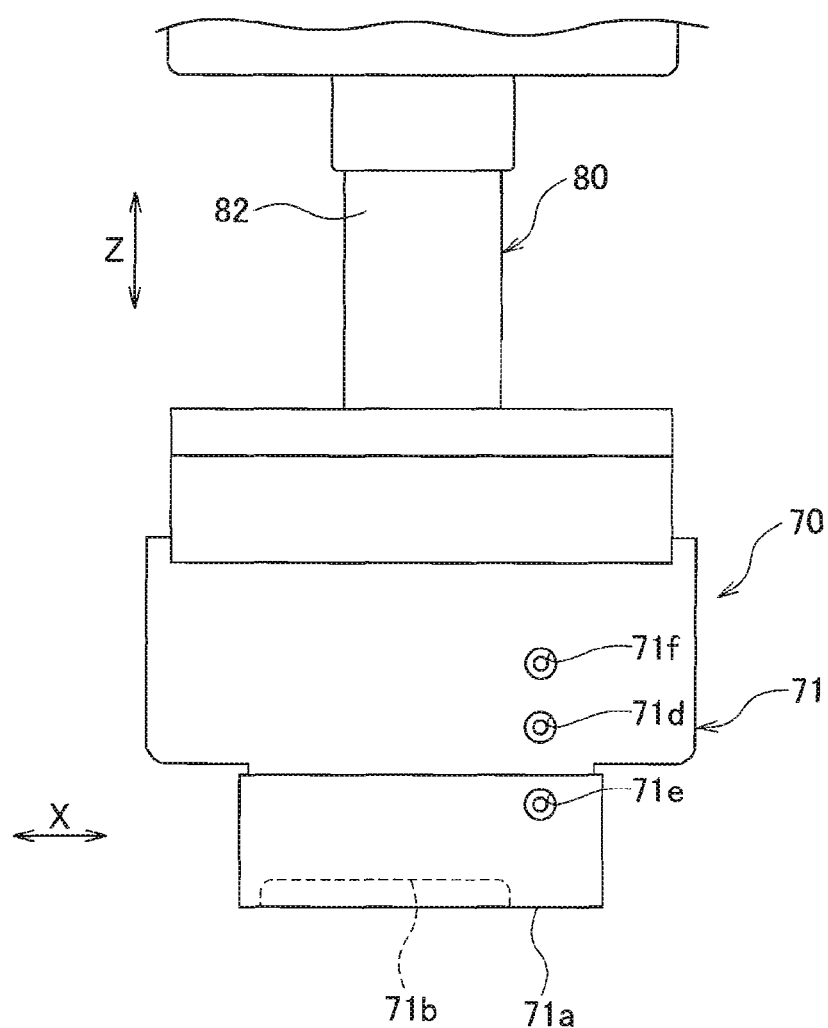
FIG. 7A is a front view of a detection head constituting a part of the apparatus for detecting component attachment shown in FIG. 3 or FIG. 5.
Figure 7B:
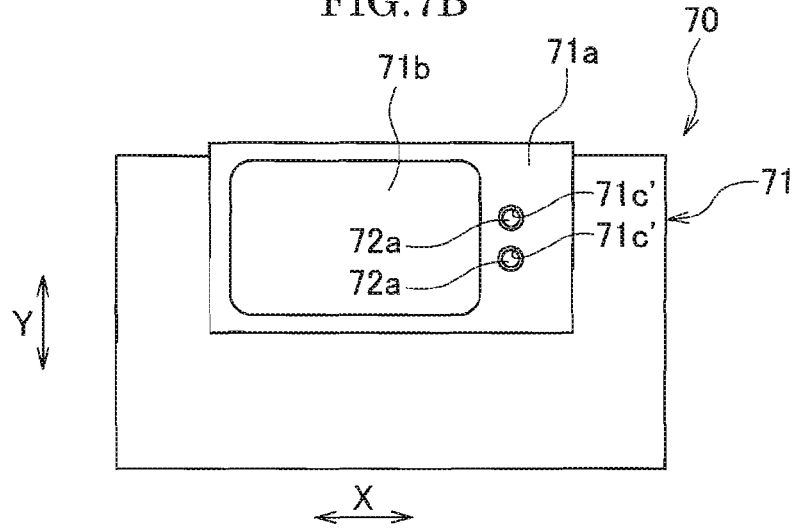
FIG. 7B is an end face (lower face) view of a detection head constituting a part of the apparatus for detecting component attachment shown in FIG. 3 or FIG. 5.
Figure 8:
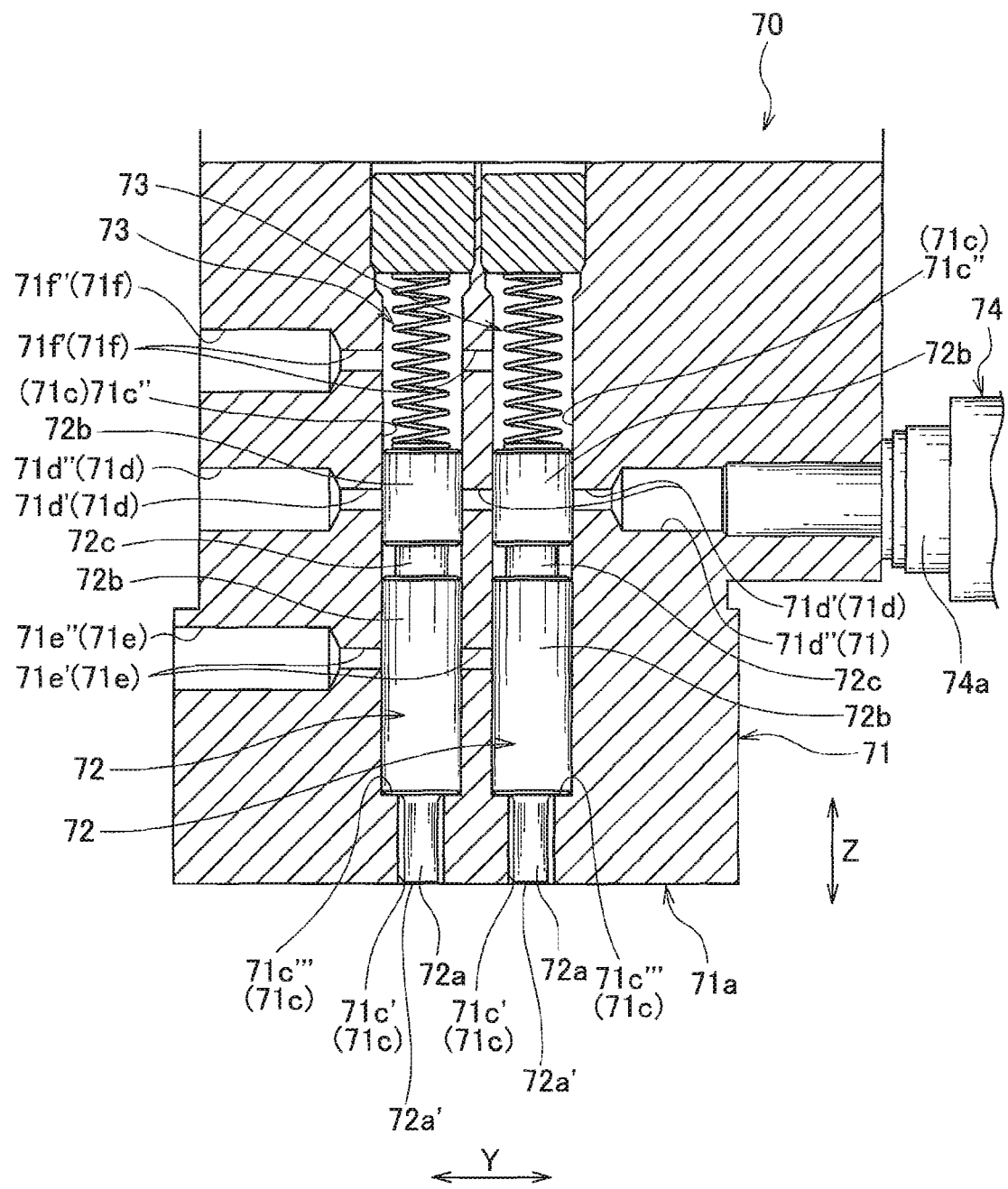
FIG. 8 is a partial sectional view illustrating an inside of the detection head shown in FIG. 6 or FIG. 7B.

The detection head 70 is, as shown in FIGS. 6 to 8, provided with a head main body 71, two movable elements 72 arranged in the head main body 71, two springs 73 for urging the movable elements 72 downward, respectively, piping 74 mounted on the head main body 71 for flowing a fluid, a detection portion 75 provided in the middle of the piping 74, a fluid supply source (not shown) provided on an upstream side of the piping 74 and the like.

The head main body 71 is, as shown in FIGS. 6 to 8, formed with a profile in which two blocks substantially in a rectangular solid shape with use of a steel material or the like are overlapped with each other and formed such that a pressing face 71*a* which is flat and forms a substantially rectangular circle, a concave portion 71*b* formed inside the pressing face 71*a*, two guide passages 71*c* elongated in the vertical direction (Z-direction), a fluid passage 71*d* elongated in the horizontal direction (Y-direction) so as to cross and communicate with the two guide passages 71*c*, 71*c*, a distal-end side auxiliary passage 71*e* formed so as to cross and communicate with the two guide passages 71*c*, 71*c* below the fluid passage 71*d*, a rear-end side auxiliary passage 71*f* formed so as to cross and communicate with the two guide passages 71*c*, 71*c* above the fluid passage 71*d* and the like are defined.

The pressing face 71*a* is formed so as to be brought into contact with the upper face of the component W2 other than the regions of the pin W11 (predetermined portion) of the component W1 and the pin hole W21 of the component W2 as well as the placing portion W12 of the component W1 and the regulating hole W22 of the component W2.

That is, the pressing face 71*a* directly applies a pressing force on the component W2 when the component W2 is pressed and attached to the component W1.

The concave portion 71*b* is formed so as not to be in contact with the regulating pin of the placing portion W12 in a state where the component W2 is correctly attached at a predetermined attachment position of the component W1.

The guide passage 71*c* guides the movable element 72 in the vertical direction (attachment direction of the component W2, Z-direction) so as to be capable of reciprocal motion, and is formed so as to define a diameter-reduced guide passage 71*c'*, a diameter-enlarged guide passage 71*c"* coaxially continuing to the diameter-reduced guide passage 71c', and a stepped portion 71c''' formed at the boundary between the diameter-reduced guide passage 71c' and the diameter-enlarged guide passage 71c'', as shown in FIG. 8.

The diameter-reduced guide passage 71c' is, as shown in FIG. 8, formed so as to have a circular section and a distal end (lower end) opened in the pressing face 71a and contains a diameter-reduced movable portion 72a of the movable element 72, which will be described later, so as to be capable of reciprocal motion with a predetermined gap space (in a non-contact manner).

The diameter-enlarged guide passage 71c'' is, as shown in FIG. 8, formed so as to have a circular section with an inner diameter larger than the diameter-reduced guide passage 71c' and a rear end (upper end) blocked, and slidably contains and guides a diameter-enlarged movable portion 72b of the movable element 72, which will be described later.

The stepped portion 71c''' is formed in an annular flat face as shown in FIG. 8 and formed so that a distal end (lower end) of the diameter-enlarged movable portion 72b of the movable element 72, which will be described later, can be brought into contact therewith.

The fluid passage 71d is, as shown in FIG. 8, formed to have a circular section and so as to orthogonally cross and to elongate in the horizontal direction (Y-direction) in a substantially intermediate region of the two diameter-enlarged guide passages 71c'', 71c'' in the vertical direction (Z-direction), one end side of which is connected to a connector 74a of piping 74 for guiding a fluid and the other end side of which is opened to the outside (atmospheric air).

Also, the fluid passage 71d is formed such that a passage area (inner diameter) of regions 71d' opened in the two diameter-enlarged guide passages 71c'', 71c'' is smaller than a passage area (inner diameter) of regions 71d'' on both end sides. As a result, (the diameter-enlarged movable portion 72b of) the movable element 72 can smoothly slide in the diameter-enlarged guide passage 71c'', and by enlarging the passage areas of the regions 71d'' on the both sides, an influence (pressure loss or the like) of the passage on the fluid flowing in the fluid passage 71d can be restrained.

The distal-end side auxiliary passage 71e has, as shown in FIG. 8, a circular section and is formed so as to orthogonally cross and to elongate in the horizontal direction (Y-direction) from the side face close to the distal end-side (lower-end side) of the two diameter-enlarged guide passages 71c'', 71c'', and one end side of which is opened to the outside (atmospheric air).

Also, in the distal-end side auxiliary passage 71e, a passage area (inner diameter) of a region 71e' opened in the two diameter-enlarged guide passages 71c'', 71c'' is formed smaller than the passage area (inner diameter) of a region 71e'' on an opening end side to the outside. As a result, (the diameter-enlarged movable portion 72b of) the movable element 72 can smoothly slide in the diameter-enlarged guide passage 71c'' and by enlarging the passage area of another region 71e'', the influence (pressure loss or the like) of the passage on the fluid flowing in the distal-end side auxiliary passage 71e can be restrained.

When the fluid (cleaned air, here) flows from the fluid passage 71d into the guide passage 71c and flows into the distal end side of the movable element 72 through a gap with the movable element 72, the distal-end side auxiliary passage 71e acts so as to emit the fluid to the outside (outside).

As a result, in case the distal-end opening of the diameter-reduced guide passage 71c' is brought into close contact with the component W2 and is closed, a fluid pressure in the diameter-reduced guide passage 71c' can be prevented from being raised so as to influence the movable element 72.

The rear-end side auxiliary passage 71 is, as shown in FIG. 8, formed with a circular section and formed so as to orthogonally cross and to elongate in the horizontal direction (Y-direction) from the side face close to the rear-end side (upper-end side) of the two diameter-enlarged guide passages 71c'', 71c'', and one end side of which is opened to the outside (atmospheric air).

Also, in the rear-end side auxiliary passage 71f, a passage area (inner diameter) of a region 71f' opened in the two diameter-enlarged guide passages 71c'', 71c'' is formed smaller than the passage area (inner diameter) of a region 71f'' on the opening end side to the outside. As a result, (the diameter-enlarged movable portion 72b of) the movable element 72 can smoothly slide in the diameter-enlarged guide passage 71f''' and by enlarging the passage area of another region 71f'', the influence (pressure loss or the like) of the passage on the fluid flowing in the distal-end side auxiliary passage 71f can be restrained.

When the fluid (cleaned air, here) flows from the fluid passage 71d into the guide passage 71c and flows into the rear end side of the movable element 72 through the gap with the movable element 72, the rear-end side auxiliary passage 71f acts so as to emit the fluid to the outside (outside).

As a result, for example, in case the movable element 72 is moved to the rear end side of the diameter-enlarged guide passage 71c'', a fluid pressure in the diameter-enlarged guide passage 71c'' can be prevented from being raised so as to influence the movable element 72.

That is, by providing the distal-end side auxiliary passage 71e and the rear-end side auxiliary passage 71f, in the moving direction of the movable element 72 (Z-direction), the fluid pressure can be prevented to act from the both end sides of the movable element 72, and the movable element 72 is pressed by the pin W11 (predetermined portion) of the component W1 and can be surely moved. As a result, misdetection can be prevented and detection with high accuracy can be realized.

The movable element 72 is, as shown in FIG. 8, provided with a diameter-reduced movable portion 72a defining a distal end portion 72a' which can be brought into contact with the pin W11 (predetermined portion) of the component W1, a diameter-enlarged movable portion 72b coaxially continuing to the diameter-reduced movable portion 72a, an annular groove 72c as a communication path formed close to the rear (above) rather than the middle of the diameter-enlarged movable portion 72b and the like.

Figure 9A:
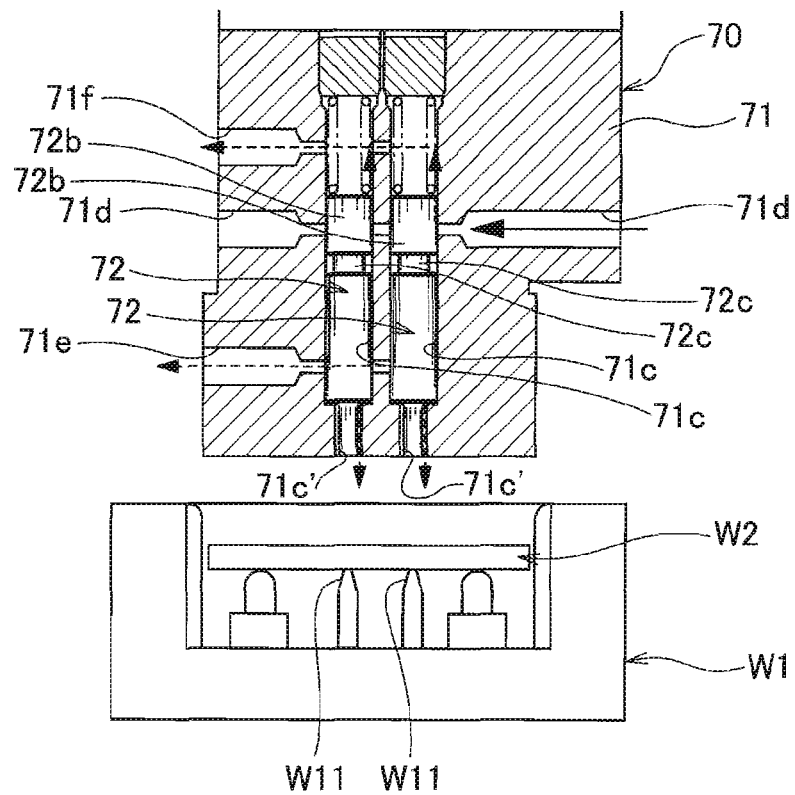
FIG. 9A is a partial sectional view for explaining an operation of the detection head shown in FIG. 8.
Figure 9B:
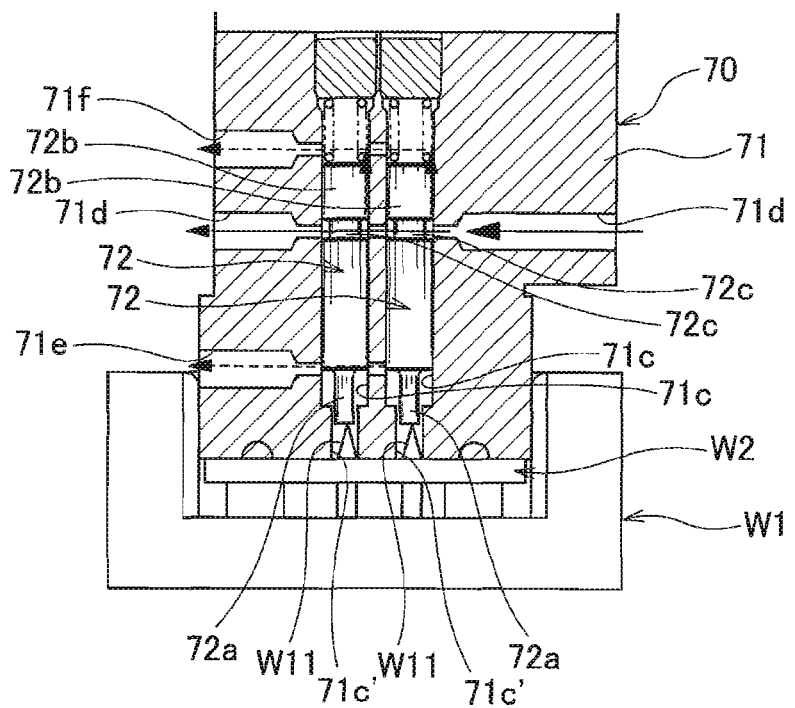
FIG. 9B is a partial sectional view for explaining the operation of the detection head shown in FIG. 8.

The diameter-reduced movable portion 72a is, as shown in FIGS. 8 to 9B, formed in a columnar shape so as to reciprocally move in the vertical direction (Z-direction) in a distal-end side region of the diameter-reduced guide passage 71c' and the diameter-enlarged guide passage 71c'' with a predetermined gap space (in a non-contact manner).

The diameter-enlarged movable portion 72b is, as shown in FIGS. 8 to 9B, formed in a columnar shape with an outer diameter larger than the diameter-reduced movable portion 72a so as to slide and reciprocally move in the vertical direction (Z-direction) in the diameter-enlarged guide passage 71c''. A small gap so as to make sliding possible is formed between an outer peripheral face of the diameter-enlarged movable portion 72b and an inner peripheral face of the diameter-enlarged guide passage 71c'' so that the fluid (cleaned air) can flow through the gap.

Also, the distal end (lower end) of the diameter-enlarged movable portion 72b is brought into contact with the stepped portion 71c''' of the guide passage 71c so as to regulate a stop position of the movable element 72.

The annular groove 72c is, as shown in FIGS. 8 to 9B, formed so as to be concave annularly over a predetermined width on the outer peripheral face of the diameter-enlarged movable portion 72b and formed such that, when the movable element 72 is moved to a predetermined position (that is, a position corresponding to a state in which the component W2 is correctly attached at a predetermined attachment position with respect to the component W1), the groove is aligned with the fluid passage 71d substantially on a straight line so as to make the fluid passages 71d located on both sides of the guide passage 71c communicate with each other and to allow a flow of the fluid in the fluid passages 71d.

Here, the annular groove 72c is employed as a communication path, but not limited to that, the movable element may be regulated so as not to rotate or may be formed in a shape that does not rotate and a through hole penetrating the diameter-enlarged movable portion 72b in the horizontal direction (Y-direction) may be employed.

Here, the movable element 72 (diameter-reduced movable portion 72a, diameter-enlarged movable portion 72b, annular groove 72c), the guide passage 71c, the fluid passage 71d, the distal-end side auxiliary passage 71e, and the rear-end side auxiliary passage 71f are formed so as to constitute a positional relation as shown in FIGS. 8 to 9B.

That is, as shown in FIGS. 8 and 9A, when the movable element 72 is located at the stop position (state in which the distal end (lower end) of the diameter-enlarged movable portion 72b is in contact with the stepped portion 71c'''), the distal end portion 72a' of the movable element 72 does not protrude from the pressing face 71a but becomes substantially flush therewith, the annular groove 72c is displaced from the fluid passage 71d and located below, the outer peripheral face of the diameter-enlarged movable portion 72b closes the distal-end side auxiliary passage 71e and the fluid passage 71d, and the rear end (upper end) of the diameter-enlarged movable portion 72b is displaced from the rear-end side auxiliary passage 71f and located below.

Also, as shown in FIG. 9B, when the movable element 72 is pushed by the pin W11 of the component W1 and moved to the predetermined position (that is, the position corresponding to a state where the component W2 is correctly attached at the predetermined attachment position with respect to the component W1), the outer peripheral face of the distal end (lower end) of the diameter-enlarged movable portion 72b is displaced from the distal-end side auxiliary passage 71e and opens the distal-end side auxiliary passage, the annular groove 72c is substantially aligned with the fluid passage 71d to be aligned on a straight line, and the rear end (upper end) of the diameter-enlarged movable portion 72b is located immediately below the rear-end side auxiliary passage 71f.

The spring 73 is, as shown in FIG. 8, a compressed type coil spring arranged in a state compressed with a predetermined compression margin so as to urge the rear end (upper end) of the movable element 72 (diameter-enlarged movable portion 82b) downward from above in the diameter-enlarged guide passage 71c''.

The spring 73 urges the movable element 72 toward the stop position in a state in which the detection head 70 does not carry out the pressing operation and detection operation, and when the detection head 70 is lowered so as to carry out the operation to press and attach the component W2 to the component W1, the spring allows that the movable element 72 is pushed in (moved upward) by the pin W11.

The piping 74 is connected to the fluid passage 71d of the head main body 71 through the connector 74a and formed so as to lead the fluid (cleaned air, here) supplied from a fluid supply source (not shown) on the upstream side with a predetermined pressure toward the fluid passage 71d.

The detection portion 75 is provided in the middle of the piping 74 and detects a flow rate or pressure of the fluid flowing through the piping 74 (that is, the fluid passage 71d).

Information detected by the detection portion 75 is sent to the control unit 90, which will be described later, and predetermined calculation processing is executed in order to detect whether or not the component W2 has been correctly attached to the component W1 (whether or not the component W2 is located at the predetermined attachment position on the component W1).

Here, the operation of the detection head 70 will be described with reference to FIGS. 9A to 10B.

First, when the detection head 70 is in the stop state, that is, when the movable element 72 is at the stop position, as shown in FIG. 9A, since the distal end portion 71a' does not protrude from the pressing face 71a, even if the detection head 70 is moved, the movable element 72 can be prevented from colliding with another member and bent or broken.

Also, when the movable element 72 is located at the stop position, as shown in FIG. 9A, the fluid passage 71d and the distal-end side auxiliary passage 71e are closed by the outer peripheral face of the diameter-enlarged movable portion 72b, and the fluid (cleaned air) supplied through the piping 74 is emitted only in a slight amount to the outside (atmospheric air) from the distal-end side auxiliary passage 71e, the rear-end side auxiliary passage 71f, and the diameter-reduced guide passage 71c' through a slight gap between the outer peripheral face of the diameter-enlarged movable portion 72b and the inner peripheral face of the guide passage 71c.

Then, the detection head 70 is lowered, the pressing face 71a pushes down (presses) the component W2 toward the component W1, and the movable element 72 is brought into contact with the pin W11 of the component W1 and is pushed up, and when, as shown in FIG. 9B, the component W2 is correctly attached at a predetermined attachment position to the component W1, the annular groove 72c of the movable element 72 is aligned with the fluid passage 71d, and the fluid (cleaned air) supplied through the piping 74 flows mainly through the fluid passage 71d. At this time, a flow rate or pressure of the fluid flowing through the piping 74 (that is, the fluid passage 71d) is detected by the detection portion 75.

Figure 11A:
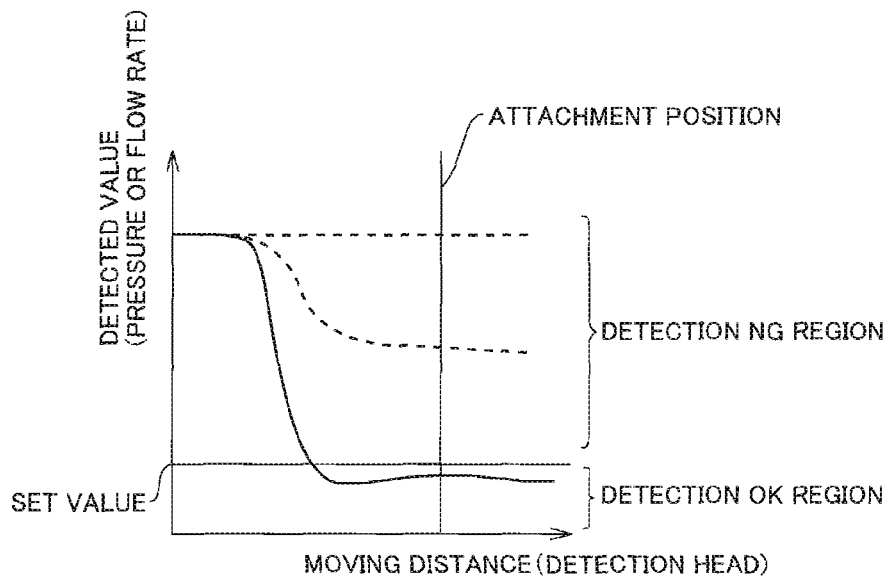
FIG. 11A is a graph illustrating a pressure of a fluid flowing through the detection head.

This detected value is compared with predetermined reference data acquired in advance, as shown in FIG. 11A, and if detection data (solid line) is located in a detection OK region when the detection head 70 reaches the predetermined attachment position, it is determined that a predetermined level is satisfied, and the fact that the component W2 is correctly attached at the predetermined attachment position to the component W1 (that is, the component is located at the predetermined attachment position) is detected.

Figure 10A:
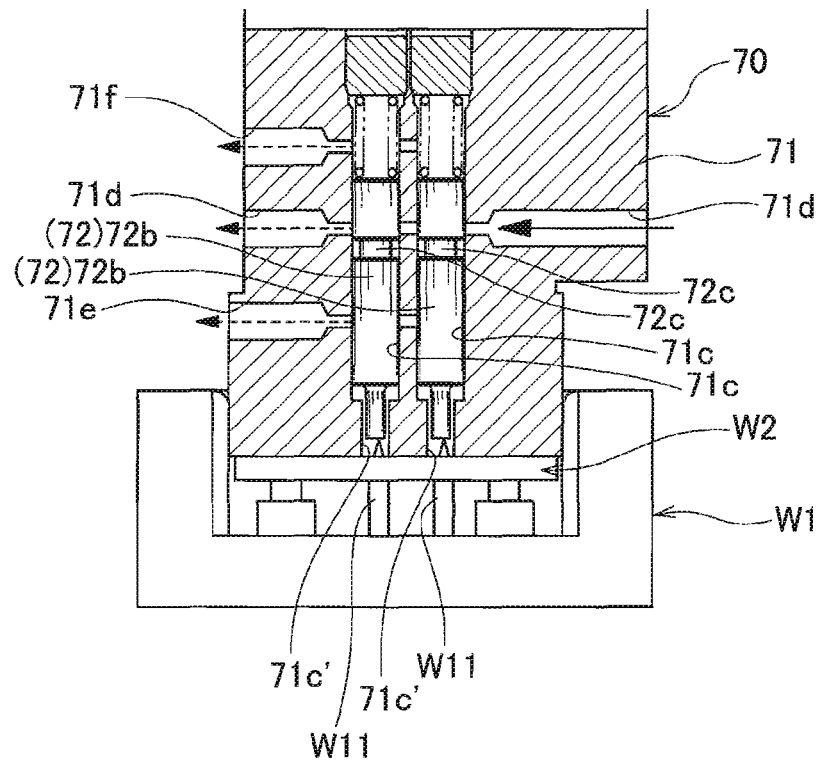
FIG. 10A is a partial sectional view for explaining the operation of the detection head shown in FIG. 8.

On the other hand, as shown in FIG. 10A, if the component W2 is not completely attached to the component W1 (the pushing down amount of the component W2 is insufficient) even if the detection head 70 is lowered, and the pressing face 71a is brought into contact with the component W2 so as to carry out the pressing operation, the movable element 72 is stopped at an intermediate position before being moved to the predetermined position where the annular groove 72c is aligned with the fluid passage 71d.

In this case, the distal-end side auxiliary passage 71e and the fluid passage 71d are closed by the outer peripheral face of the diameter-enlarged movable portion 72b, and in addition, the distal-end opening of the diameter-reduced guide passage 71c' is also closed and therefore, the fluid (cleaned air) supplied through the piping 74 is emitted only in a slight amount to the outside (atmospheric air) from the distal-end side auxiliary passage 71e and the rear-end side auxiliary passage 71f through a slight gap between the outer peripheral face of the diameter-enlarged movable portion 72b and the inner peripheral face of the guide passage 71c and also emitted only in a slight amount from the fluid passage 71d. At this time, the flow rate or pressure of the fluid flowing through the piping 74 (that is, the fluid passage 71d) is detected by the detection portion 75.

This detected value is, as shown in FIG. 11A, compared with the predetermined reference data acquired in advance, and if the detection data (dot line) is located in a detection NG region when the detection head 70 reaches the predetermined attachment position, it is determined that a predetermined level is not satisfied, and the fact that the component W2 is not correctly attached at the predetermined attachment position to the component W1 (that is, the component is not located at the predetermined attachment position) is detected.

Figure 10B:
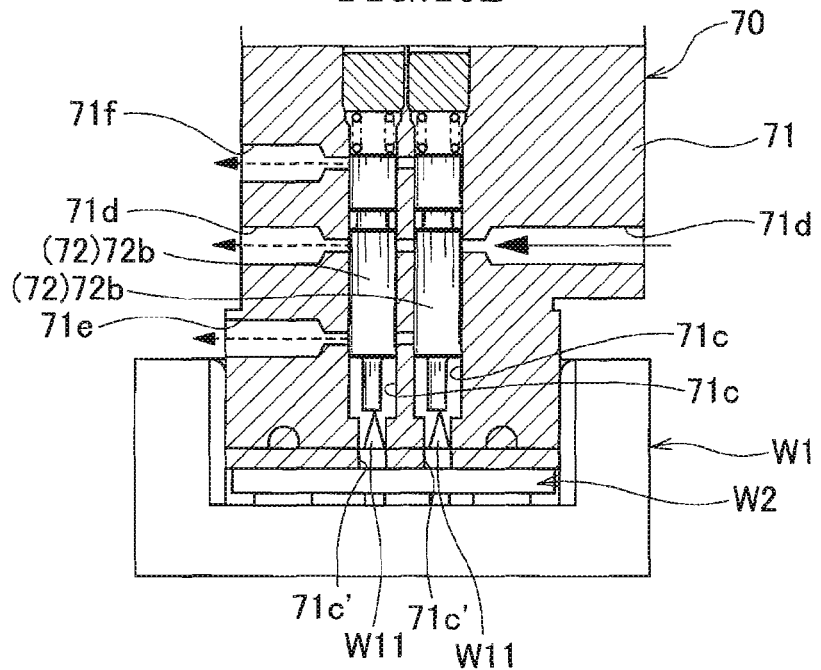
FIG. 10B is a partial sectional view for explaining the operation of the detection head shown in FIG. 8.

On the other hands as shown in FIG. 10B, if the component W2 is not completely attached to the component W1 (the component W2 is pushed down too much) even if the detection head 70 is lowered, and the pressing face 71a is brought into contact with the component W2 so as to carry out the pressing operation, the movable element 72 passes by the predetermined position where the annular groove 72c is aligned with the fluid passage 71d and excessively moves and is stopped at a position above.

In this case, in addition to the distal-end side auxiliary passage 71e and the fluid passage 71d, the rear-end side auxiliary passage 71f is also closed by the outer peripheral face of the diameter-enlarged movable portion 72b, and moreover, the distal-end opening of the diameter-reduced guide passage 71c' is closed and therefore, the fluid (cleaned air) supplied through the piping 74 is emitted only in a slight amount to the outside (atmospheric air) from the distal-end side auxiliary passage 71e and the rear-end side auxiliary passage 71f through the slight gap between the outer peripheral face of the diameter-enlarged movable portion 72b and the inner peripheral face of the guide passage 71c and also emitted only in a slight amount from the fluid passage 71d. At this time, the flow rate or pressure of the fluid flowing through the piping 74 (that is, the fluid passage 71d) is detected by the detection portion 75.

This detected value is, as shown in FIG. 11A, compared with the predetermined reference data acquired in advance, and if the detection data (dot line) is located in the detection NG region when the detection head 70 reaches the predetermined attachment position (when passing by the attachment position), it is determined that a predetermined level is not satisfied, and the fact that the component W2 is not correctly attached at the predetermined attachment position to the component W1 (that is, the component is not located at the predetermined attachment position) is detected.

As mentioned above, with the simple structure to detect fluctuation of the fluid interlocking with the movement of the movable element 72, whether or not the component W2 is attached at the predetermined attachment position (whether or not the component W2 is located at the predetermined attachment position) can be detected easily and with high accuracy, regardless of the material of the components W1, W2 and the like.

Also, in the detection head 70 of this apparatus, two pairs of combination of the movable element 72, the guide passage 71c, and the spring 73 are arranged and disposed in a state in which the fluid passage 71d, the distal-end side auxiliary passage 71e, and the rear-end side auxiliary passage 71f are made in common, and the two movable elements 72 are arranged so as to correspond to the two corresponding pins W11, respectively. Thus, when the two movable elements 72 are moved to the predetermined position together, it can be detected that the component W2 is surely attached to the component W1 without inclination.

The head driving mechanism 80 is, as shown in FIGS. 3, 4, and 6, provided on the upper-side arm portion 43 of the elevating holder 40 and is provided with a driving actuator 81 generating an elevating driving force, a telescopic rod 82 telescopically moved by the driving actuator 81 and connected to the detection head 70 at the lower end portion and the like.

The driving actuator 81 is an NC cylinder using a hydraulic or pneumatic driving motor or the like, and the telescopic rod 82 is telescopically moved by rotation of the hydraulic or pneumatic driving motor.

That is, if the driving actuator 81 generates a driving force in one direction, the telescopic rod 82 is elongated downward so as to lower the detection head 70, while if the driving actuator 81 generates the driving force in another direction, the telescopic rod 82 is contracted upward so as to raise the detection head 70.

Instead of the driving actuator 81 and the telescopic rod 82, a driving mechanism using a driving motor, a ball screw and a ball nut, rack and pinion mechanism and the like may be employed.

Figure 11B:
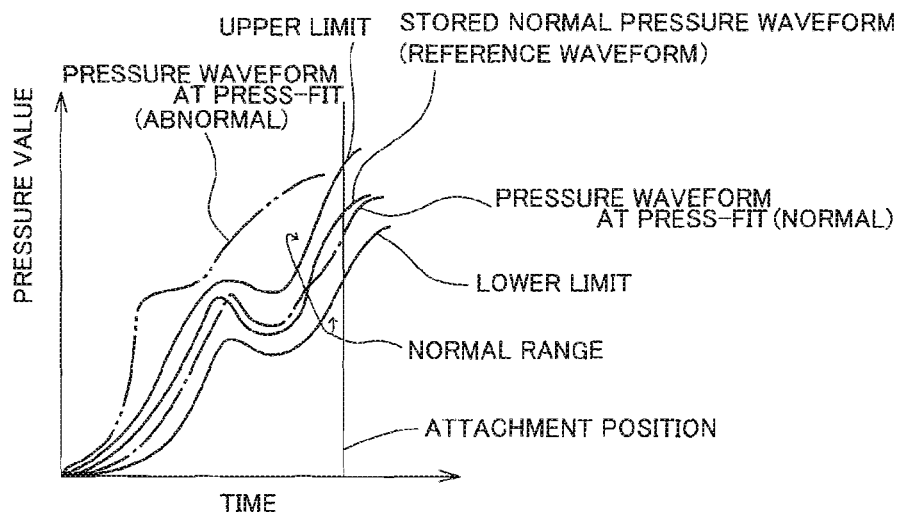
FIG. 11B is a graph illustrating pressing pressure in component attachment by the detection head.

The control unit 90 governs driving control of the holder driving mechanism 50 and the head driving mechanism 80 and driving control of the fluid supply source and is provided with a control portion for executing appropriate calculation processing of detection information of the detection portion 75, a storage portion storing a pressure waveform of the fluid to be a reference of pressing in component attachment as shown in FIG. 11B and other various types of information and the like.

The control unit 90 detects a pressure value applied on the telescopic rod 82 on a real-time basis when the component is to be attached and monitors so that the component is attached in a predetermined range with respect to the reference pressure waveform.

The conveying unit 100 is, as shown in FIGS. 3 to 5, provided with two conveying guides 101, 101 extending in the horizontal direction (X-direction), and a plurality of rollers 102 rotated and driven by a rotating driving force inside the conveying guide 101 and the like, in an upper region than the positioning unit 60.

The conveying unit 100 carries in the pallet P on which the components W1, W2 conveyed by the conveying line L on the upstream side are placed immediately above the positioning unit 60 and stops the pallet P and carries out the pallet P on which the components W1, W2 for which predetermined attachment processing is completed are placed toward the conveying line L on the downstream side.

As mentioned above, by providing the conveying unit 100, the pallet P can be automatically carried in a predetermined work area and can be automatically carried out of the work area.

Subsequently, an operation of the apparatus for detecting component attachment (method for detecting component attachment) will be described with reference to FIGS. 12 to 14.

Figure 12:
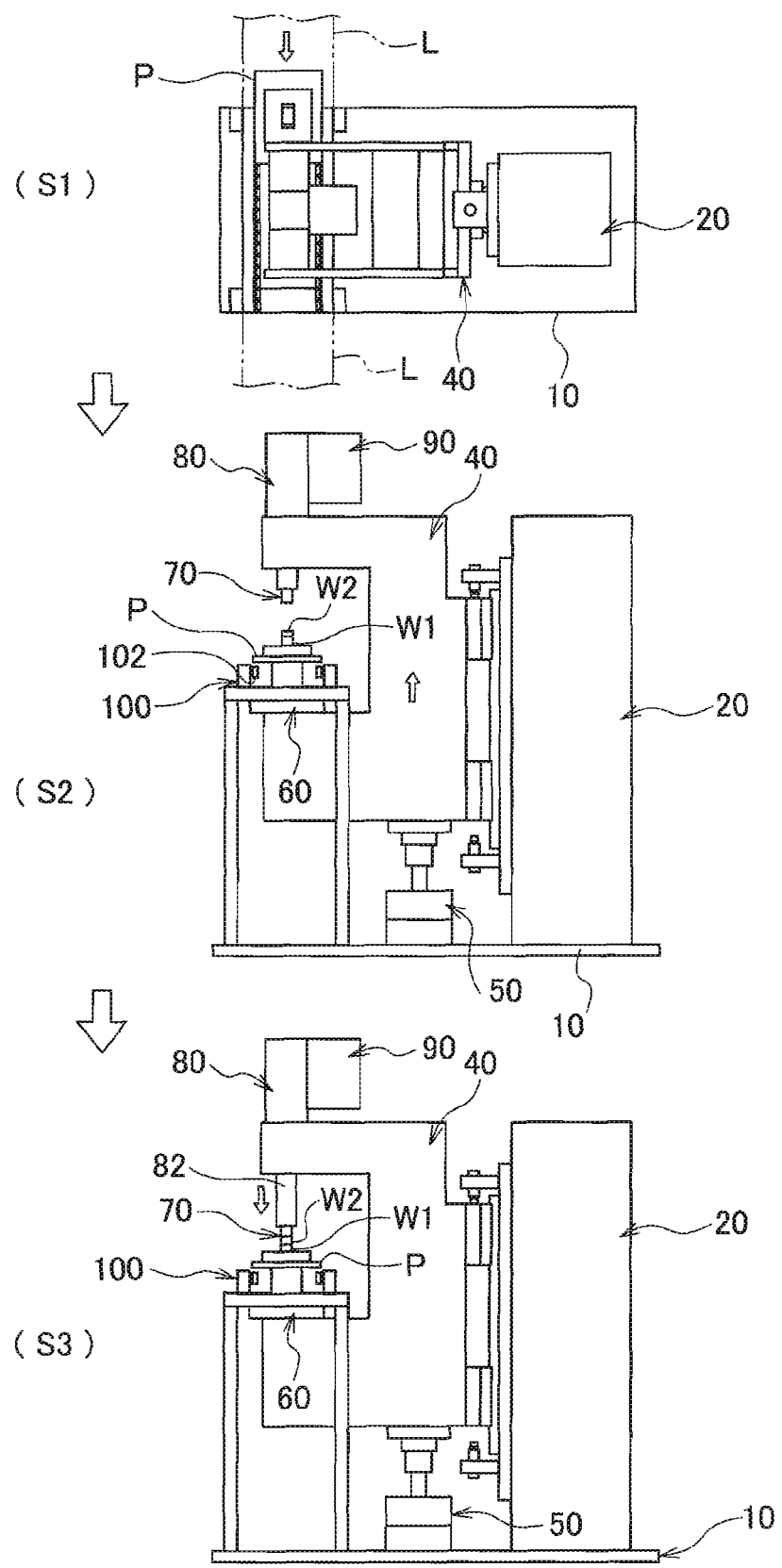
FIG. 12 is an operation diagram for explaining an operation of the apparatus for detecting component attachment according to the present invention.

First, as shown in Step (S1) in FIG. 12, the pallet P on which the components W1, W2 are placed is carried in the conveying unit 100 by the conveying line L on the upstream side. The component W2 is temporarily attached to the component W1 and placed on the pallet P through a holder for work.

Subsequently, the conveying unit 100 receives the pallet P, carries in the pallet immediately above the positioning unit 60 and stops the pallet. Then, by means of the raising driving of the holder driving mechanism 50, the elevating holder 40 is raised to a predetermined height, and as shown in Step (S2) in FIG. 12, the positioning unit 60 lifts the pallet P from the roller 102, holds it and positions it to a predetermined work position.

Subsequently, by means of the lowering driving of the head driving mechanism 80, as shown in Step (S3) in FIG. 12, the detection head 70 is lowered, and as shown in Step (S4) in FIG. 13, the pressing face 71a of the detection head 70 is brought into contact with the upper face of the component W2.

Figure 13:
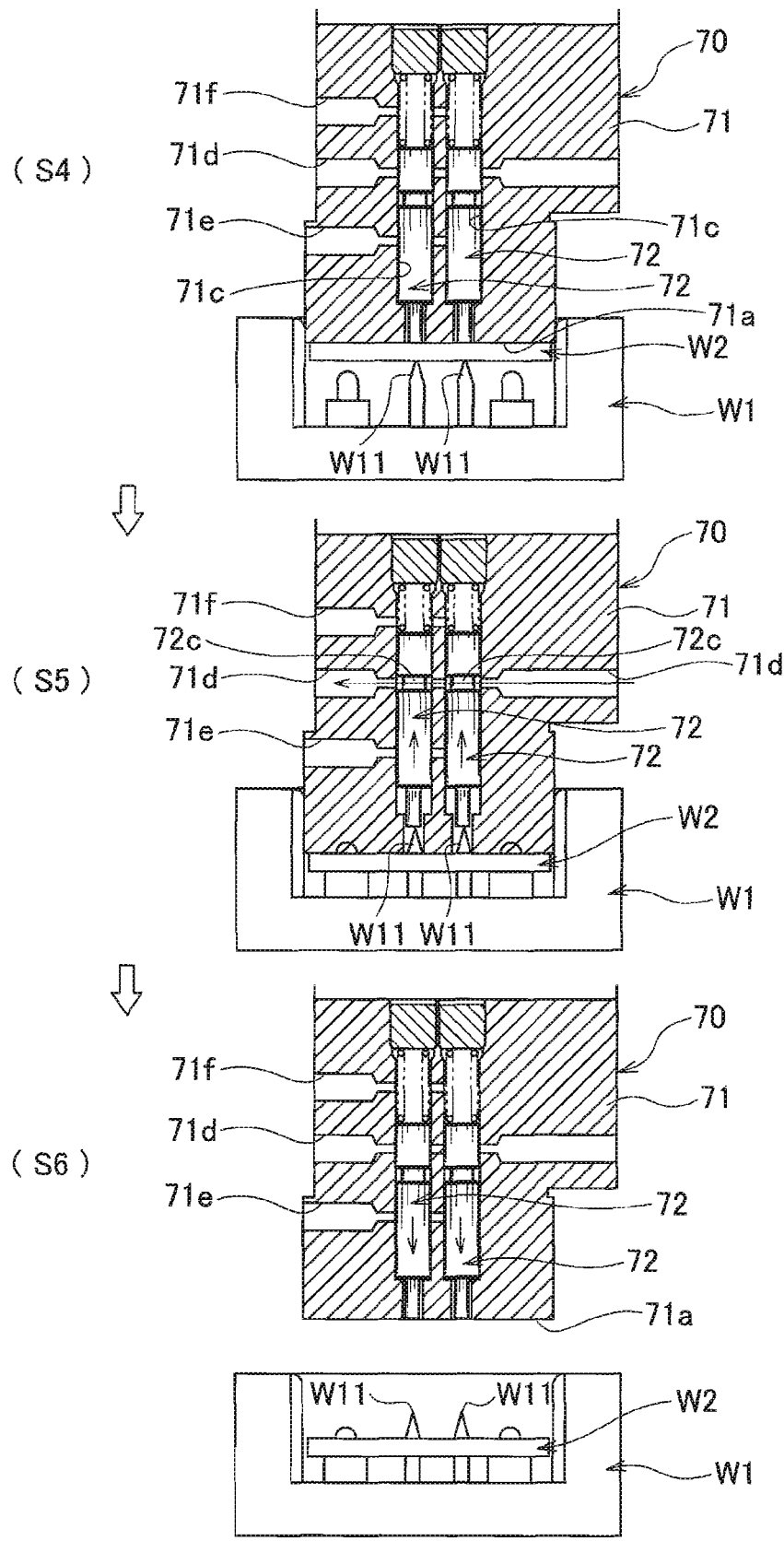
FIG. 13 is an operation diagram for explaining the operation of the apparatus for detecting component attachment according to the present invention.

Moreover, the detection head 70 is lowered and its pressing face 71a pushes down the upper face of the component W2, and as shown in Step (S5) in FIG. 13, at the same time when the component W2 reaches the predetermined attachment position with respect to the component W1 (pressing operation is completed), the movable element 72 is brought into contact with the pin W11 and is pushed upward so as to reach the predetermined position in the guide passage 71c.

At this time, the annular groove 72c of the movable element 72 is aligned with the fluid passage 71d, the fluid flows through the fluid passage 71d, a pressure (or a flow rate) of the fluid is detected by the detection portion 75, and the detection information is sent to the control unit 90. The control unit 90 executes appropriate calculation processing of the detection information, and it is detected, here, that the component W2 is correctly attached at the predetermined attachment position of the component W1 (the component W2 is located at the predetermined attachment position on the component W1).

This result is notified to an administrator as "OK" information by predetermined display means.

If the movable element 72 does not reach the predetermined position, as shown in FIGS. 10A and 10B, it is detected that the component W2 is not correctly attached to the component W1 (the components W2 is not located at the predetermined attachment position on the component W1), and the detection result is notified to the administrator as "NG" information by the predetermined display means.

As mentioned above, by detecting the fluctuation of the fluid accompanying the movement of the movable element 72 at the same time when the pressing operation to press and attach the component W2 is completed, the attachment operation of the component W2 and the detection operation of the component W2 can be executed substantially at the same time or continuously, which eliminates a need of a preparation work during that and can simplify the entire processing operation and can shorten a cycle time of the processing operation.

After that, by means of the raising driving of the head driving mechanism 80, as shown in Step (S6) in FIG. 13, the detection head 70 starts rising away from the component W2, while the movable element 72 is returned to the stop position by an urging force of the spring 73 and closes the fluid passage 71d.

Figure 14:
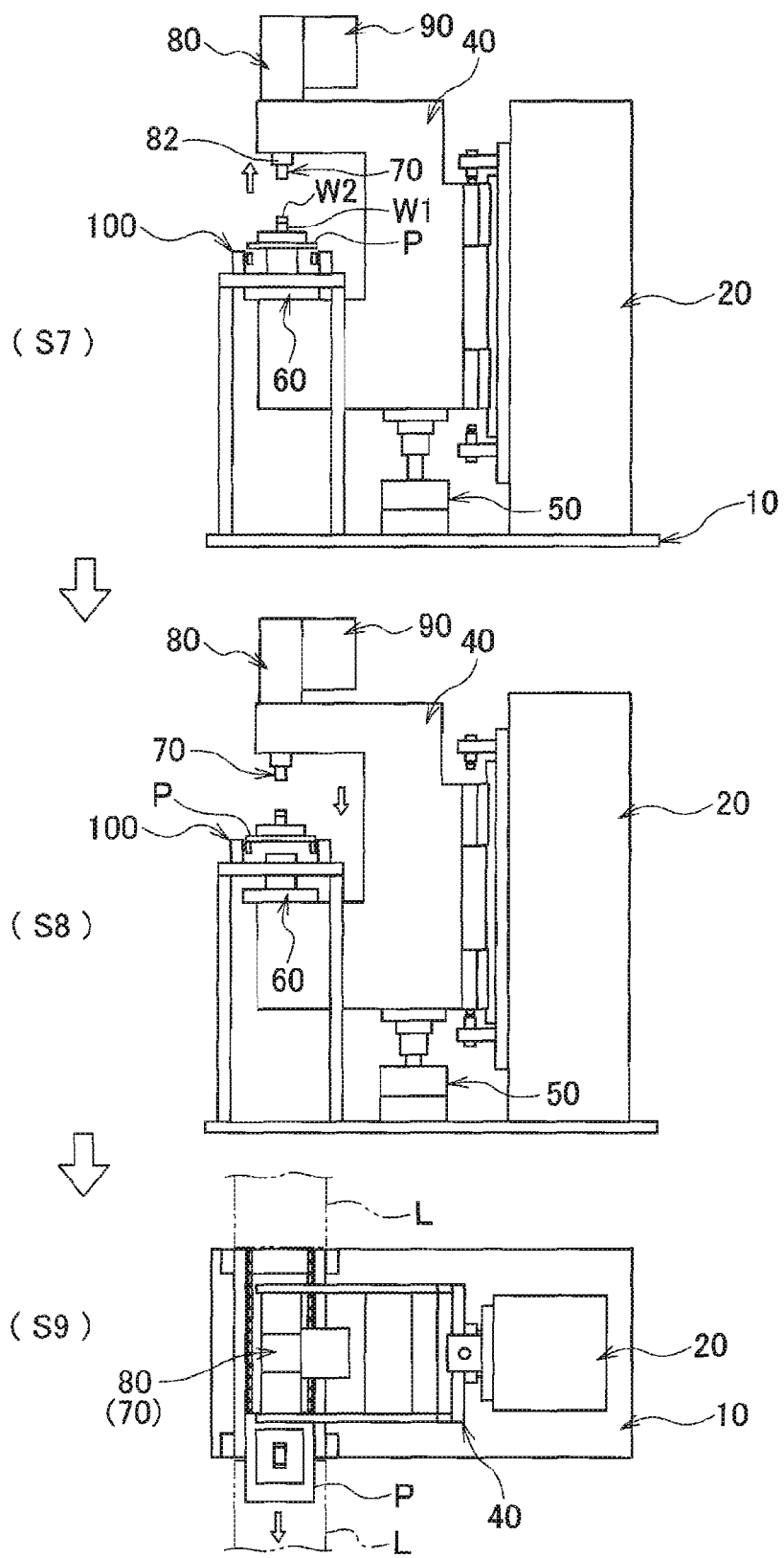
FIG. 14 is an operation diagram for explaining the operation of the apparatus for detecting component attachment according to the present invention.

Moreover, the detection head 70 continues to rise and, as shown in Step (S7) in FIG. 14, when it returns to a predetermined standby position, by means of the lowering driving of the holder driving mechanism 50, the elevating holder 40 is lowered and, as shown in Step (S8) in FIG. 14, the positioning unit 60 is lowered to the standby position and transfers the pallet P onto the conveying unit 100.

After that, as shown in Step (S9) in FIG. 14, the conveying unit 100 carries out the pallet P toward the conveying line L on the downstream side.

According to the above apparatus, since the fluctuation of the fluid interlocking with the movement of the movable element 72 is detected, as compared with the conventional case in which an optical sensor or electric conductivity is used, the structure can be simplified and whether or not the component W2 is attached at the predetermined attachment position (whether or not the component W2 is located at the predetermined attachment position) can be detected easily and with high accuracy, regardless of the material of the components W2, W1 and the like.

Also, since the method for detecting presence or absence of the component W2 or whether or not the component W2 is attached at the predetermined attachment position by detecting a pressure or flow rate of the flowing fluid when the movable element 72 is brought into contact with the pin W11 (predetermined portion) of the component W1 and pushed and moved is applied, the detection can be made easily and with high accuracy.

Moreover, since the fluctuation of the fluid accompanying the movement of the movable element 72 is detected at the same time when the pressing operation to press and attach the component W2 is completed, the attachment operation of the component W2 and the detection operation of the component W2 can be executed substantially at the same time or continuously, which eliminates a need of a preparation work during that and can simplify the entire processing operation and can shorten a cycle time of the processing operation.

In the above embodiment, the case in which the cleaned air is used as the fluid made to flow through the fluid passage 71d is illustrated, but not limited to that, an inactive gas, any other gas, a liquid or the like may be applied. If a gas other than air or a liquid is to be applied, it may be so configured that the ends of the fluid passage 71d, the distal-end side auxiliary passage 71e, and the rear-end side auxiliary passage 71f are not opened to the atmospheric air as the outside, but a closed loop may be constituted so that the fluid is circulated.

In the above embodiment, the flow direction of the fluid is a direction emitted from the fluid supply source to the atmospheric air side, but the atmospheric air may be sucked into the fluid supply source side. As a result, the configuration of the present invention may be employed in a clean atmosphere.

In the above embodiment, the case in which the two movable elements 72 are formed to be brought into contact with the two pins W11 provided at the single component W1 is illustrated, but not limited to that, it may also be configured such that the movable elements are provided so as to correspond to the predetermined portion of the single component, respectively, that is, to correspond to the plurality of components, respectively, and it is detected whether or not each of the components is attached at the predetermined attachment position (whether or not each of the components is located at the corresponding respective attachment positions).

In the above embodiment, the case in which the distal-end side auxiliary passage 71e and the rear-end side auxiliary passage 71f are provided in addition to the liquid passage 71d in the head main body 71, but not limited to that, only the rear-end side auxiliary passage 71f may be employed, or if an influence of a fluid pressure in the moving direction of the movable element 72 can be ignored, these auxiliary passages may be abolished.

In the above embodiment, the case in which the detection head 70 is driven in the vertical direction so as to attach the component W2 to the component W1 and the detection operation is carried out is illustrated, but not limited to that, the attachment operation and the detection operation may be carried out by reciprocally moving the detection head in the lateral direction or diagonal direction.

In the above embodiment, the case in which the pressing face 71*a* is provided in the detection head 70 and the pressing operation and the detection operation of the component are carried out is illustrated, but not limited to that, the detection head may carry out only the detection operation.

In the above embodiment, the case in which the apparatus is integrally provided with the conveying unit 100 is illustrated, but not limited to that, and the conveying unit 100 may be abolished, and the conveying line already installed in the production system (mounting line, manufacturing line and the like) may be installed so as to be sandwiched by the elevating holder 40.

As mentioned above, the apparatus and method for detecting component attachment of the present invention can detect presence or absence of a component or whether or not a component is surely attached at a predetermined attachment position easily and with high accuracy with a simple structure, regardless of a material of the component or the like and can carry out the detection operation at the same time when the press operation is completed, and therefore not only that the present invention can be applied to a mounting line of an electronic component or the like but is also useful in a manufacturing line of a mechanical component or any other components and the like.

The invention claimed is:

1. An apparatus for detecting component attachment, the apparatus comprising:
   a detection head for detecting a presence or an absence of a component or whether or not the component is attached; and
   a driving mechanism for driving the detection head in an attachment direction of the component, wherein
   the detection head includes a movable element having a front end portion capable of being brought into contact with a predetermined portion of the component and a rear portion on an opposite side of the front end portion, a guide passage for guiding the movable element so as to be capable of reciprocal motion in the attachment direction, a fluid passage formed so as to cross and communicate with the guide passage for passing a fluid when the front end portion is brought into contact with the predetermined portion of the component and pushed and the movable element is moved to a predetermined position, and a detection portion for detecting a pressure or a flow rate of the fluid flowing through the fluid passage, wherein
   the movable element has a diameter-reduced movable portion forming the front end portion, and a diameter-enlarged movable portion having a diameter larger than that of the diameter-reduced movable portion and forming the rear end portion and a communication path communicating with the fluid passage so as to enable a flow of the fluid when moved to the predetermined position, and
   the guide passage has a diameter-reduced guide passage formed at a side of the front end portion for containing the diameter-reduced movable portion with a predetermined gap space, and a diameter-enlarged guide passage formed at a side of the rear end portion for slidably containing and guiding the diameter-enlarged movable portion, and wherein
   the detection head further includes a front-end side auxiliary passage that communicates with the diameter-enlarged guide passage at a side of the front end portion with respect to the fluid passage and passes the fluid outward from the diameter-enlarged guide passage, and a rear-end side auxiliary passage that communicates with the diameter-enlarged guide passage at a side of the rear end portion with respect to the fluid passage and passes the fluid outward from the diameter-enlarged guide passage.

2. The apparatus for detecting component attachment according to claim 1, wherein
   the detection head includes a spring for urging the rear end portion of the movable element toward a stop position where the diameter-enlarged movable portion is in contact with a boundary portion formed at a boundary between the diameter-reduced guide passage and the diameter-enlarged guide passage.

3. The apparatus for detecting component attachment according to claim 1, wherein
   the fluid passage, the front-end side auxiliary passage, and the rear-end side auxiliary passage are formed such that a passage area of a region opened in the diameter-enlarged guide passage is smaller than a passage area of other regions.

4. The apparatus for detecting component attachment according to claim 2, wherein
   the detection head has a pressing face for pressing a region other than the predetermined portion of the component.

5. The apparatus for detecting component attachment according to claim 4, wherein
   the movable element is formed such that the front end portion does not protrude from the pressing face when being positioned at the stop position.

6. The apparatus for detecting component attachment according to claim 4, further comprising:
   a positioning unit for positioning a pallet on which the component is placed at a predetermined work position; and
   an elevating holder for holding and elevating the positioning unit, wherein
   the elevating holder holds the detection head at an upper region opposing the positioning unit and holds the driving mechanism for driving the detection head.

* * * * *